United States Patent [19]
Kuo et al.

[11] Patent Number: 5,870,048
[45] Date of Patent: Feb. 9, 1999

[54] OVERSAMPLING SIGMA-DELTA MODULATOR

[75] Inventors: Chung J. Kuo; Chian C. Ho, both of Chiayi, Taiwan

[73] Assignee: National Science Council, Taipei, Taiwan

[21] Appl. No.: 910,685

[22] Filed: Aug. 13, 1997

[51] Int. Cl.$^6$ .................................................. H03M 3/00
[52] U.S. Cl. ........................... 341/143; 341/155; 341/144
[58] Field of Search ..................................... 341/143, 118, 341/136, 144, 155

[56] References Cited

U.S. PATENT DOCUMENTS

| | | | |
|---|---|---|---|
| 4,704,600 | 11/1987 | Uchimura et al. | 340/347 |
| 5,274,375 | 12/1993 | Thompson | 341/143 |
| 5,323,157 | 6/1994 | Ledzius et al. | 341/143 |

*Primary Examiner*—Brian Young

[57] ABSTRACT

Based on the recently developed MASH (multistage noise shaping) architecture, an improved architecture—uni-MASH which employs the time-division concept for architecture and circuit reuse is proposed. An oversampling sigma-delta modulator having uni-MASH architecture uses a single stage of time- and capacitor-integrator in lieu of multiple stages of integrators, digital-to-analog converters and quantizers used in the MASH architecture. Uni-MASH retains robust stability and high-ordered noise shaping factor of MASH's virtues.

4 Claims, 7 Drawing Sheets

Figure 5(a)    (Prior Art)

Clock Timing: $\phi \rightarrow \overline{\phi} \rightarrow \phi$

Clock Timing: $\overline{\phi_1} \rightarrow \phi_1 \rightarrow \overline{\phi_2} \rightarrow \phi_2 \rightarrow \overline{\phi_1}$

OVERSAMPLING SIGMA-DELTA MODULATOR

FIELD OF THE INVENTION

The present invention is related to an oversampling sigma-delta modulator for use in digital-to-analog conversion and analog-to-digital conversion, and in particular to a multistage noise shaping (MASH) modulator.

BACKGROUND

The advent of VLSI digital IC technologies has made it attractive to perform many signal processing functions in the digital domain placing important emphasis on A/D and D/A conversions. Oversampling sigma-delta converters composed of simple and relatively high-tolerance analog components have recently become popular because they avoid a lot of difficulties encountered with conventional methods for A/D and D/A conversion. Classical sigma-delta modulators as shown in FIGS. 1(a), 1(b) and 1(c) use the technique of oversampling and noise shaping to move most of the quantization noise into high frequency band, well outside the band of the signal. Then, with a low-pass filter and decimator, we can easily filter out the high frequency noise such that the SNR at the signal band is significantly increased. In addition, the sigma-delta modulator (SDM) can trade resolution in time for that in amplitude such that imprecise analog circuits may be used. The use of high-frequency modulation and demodulation can eliminate the need for abrupt cutoffs in analog anti-aliasing prefilters at the input to the A/D converter, as well as in the smoothing postfilters at the analog output of the D/A converter. Besides, the performance of SDM is insensitive to nonideal effects, such as analog component matching or amplifier imperfection.

However, instability is a serious problem for high order SDM. The limitation of the high order SDM stems from the fact that high order integration cannot be realized due to the oscillation of the feedback loop. In this case, the modulator would settle into a large-amplitude low-frequency limit and result in instability. To improve the stability of higher-ordered SDM, three-stage MASH configuration is proposed in U.S. Pat. No. 4,704,600 (1987). MASH as shown in FIGS. 2(a) and 2(b) is a promising architecture to permit high-ordered noise shaping factor without instability problem, because it can offer an always stable modulation. MASH composes of several (first-ordered) SDM in cascade. The input of the next stage SDM is the quantization noise of the previous stage SDM. The quantization noises of the intermediate stage SDM are then all digitally cancelled. Thus only the quantization noise from the last stage SDM is left and MASH becomes always stable. However, there are still some defects in MASH architecture. For example, the quantization noise cancellation is sensitive to the gain matching accuracy between each stage of MASH. In addition, more operational amplifiers and more capacitors are required in MASH than in classical architecture such that the chip size of MASH increases.

In a classical second-ordered sigma-delta modulator as shown in FIG. 1(b), its transfer function is:

$$Y = X + (1-Z^{-1})^2 Q$$

Y: digital output  X: analog input  Q: quantization noise

In view of the above transfer function, the resolution of classical sigma-delta modulator is predominantly governed by order of noise shaping function and oversampling ratio.

Also, the transfer function of the two-stage MASH as shown in FIG. 2(b) is as follows:

$$C_1 = X + (1-Z^{-1})Q_1$$
$$C_2 = -Q_1 + (1-Z^{-1})Q_2$$
$$Y = C_1 + (1-Z^{-1})C_2 = X + (1-Z^{-1})Q_1 - (1-Z^{-1})Q_1 + (1-Z^{-1})^2 Q_2$$
$$= X + (1-Z^{-1})^2 Q_2$$

$C_1$: first-stage digital output  $C_2$: second-stage digital output $Q_1$: first-stage quantization noise  $Q_2$: second-stage quantization noise Y: digital output signal  X: analog input signal In view of the above transfer function, the two-stage MASH offers second-ordered noise shaping factor as classical second-ordered SDM. But highly stable characteristic of MASH is identical to the first-ordered SDM.

SUMMARY OF THE INVENTION

The present invention provides an oversampling sigma-delta modulator with sampling frequency sufficiently higher than an input signal frequency. The oversampling sigma-delta modulator of the present invention comprises N integrators (N is an integer not less than 2) in parallel for integrating a difference between an input terminal signal and a feedback signal; a quantizer for quantizing an output from each of said N integrators; means for converting an output from said quantizer to said feedback signal; means for detecting a (n-1)th quantization error generated by said quantizer when said quantizer quantizes an output from a (n-1)th integrator (n is an integer of 2 to N) of said N integrators; wherein a first loop output signal is generated at an output terminal of said quantizer when an output of a first integrator of said N integrators is quantized by said quantizer, and a nth loop output signal is generated at an output terminal of said quantizer when an output of a nth integrator of said N integrators is quantized by said quantizer; a first switch for selectively supplying an input signal as said input terminal signal to said first integrator or supplying said (n-1)th quantization error as said input terminal signal to said nth integrator; a second switch for selectively supplying said first loop output signal to a delay or supplying said nth loop output signal to a nth differentiator with a transfer function of a reciprocal number of a product of transfer functions of said first to (n-1)th integrators; an adding means for adding outputs from said differentiators to said first loop output signal from said delay; and a switch control means for controlling said first and second switches so that said input signal and said (n-1)th quantization error are supplied in sequence to the first integrator and said nth integrator, and said first loop output signal and said nth loop output signal are supplied in sequence to said delay and said nth differentiator.

Preferably, said N integrators of the oversampling sigma-delta modulator of the present invention are realized by a time- and capacitor-multiplexing switched-capacitor integrator which comprises an operational amplifier having its non-inverting (+) terminal grounded, and N capacitors each of which is connected in parallel between an inverting (−) terminal and an output terminal of said operational amplifier through a switch circuit, wherein said switch circuits are controlled by a switch control circuit so that a first or a nth capacitor is connected between said inverting terminal and said output terminal of said operational amplifier when said first integrator or said nth integrator is operated.

Said means for detecting a (n-1)th quantization error of the oversampling sigma-delta modulator of the present invention may comprise an adding means for providing a difference as said (n-1)th quantization error between said output from said (n-1)th integrator and said output from said quantizer.

Said means for converting an output from said quantizer to said feedback signal of the oversampling sigma-delta modulator of the present invention preferably has a diginal-to-analog conversion function for converting a digital input signal to an analog signal.

BRIEF DESCRIPTION OF THE DRAWINGS

FIGS. 1(a), 1(b) and 1(c) are block diagrams showing architectures of classical sigma-delta modulators for analog-to-digital conversion, wherein FIG. 1(a) is a first-order sigma-delta modulator; FIG. 1(b) is a second-order sigma-delta modulator and FIG. 1(c) is a high-order sigma-delta modulator.

FIGS. 2(a) and 2(b) are block diagrams showing architectures of cascaded sigma-delta modulators for analog-to-digital conversion, wherein FIG. 2(a) is a three-stage MASH architecture and FIG. 2(b) is a two-stage MASH architecture.

FIG. 5(a) is a simulated power spectrum of the modulator having the MASH architecture shown in FIG. 2(b) by ignoring the gain mismatching problem between the two stages, wherein the input signal is a 1 kHz sinusoidal signal, the sampling frequency is 128 kHz and the oversampling ratio is 64.

DETAILED DESCRIPTION OF THE INVENTION

Figure 1A:
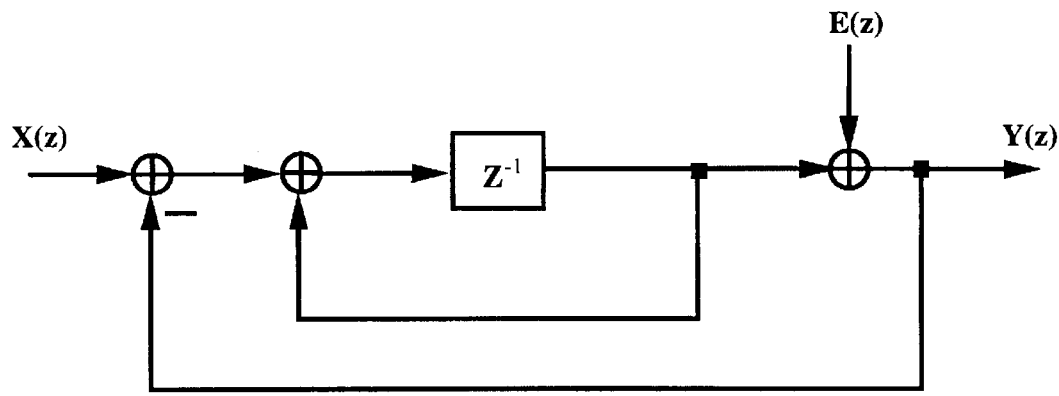
Figure 1B:
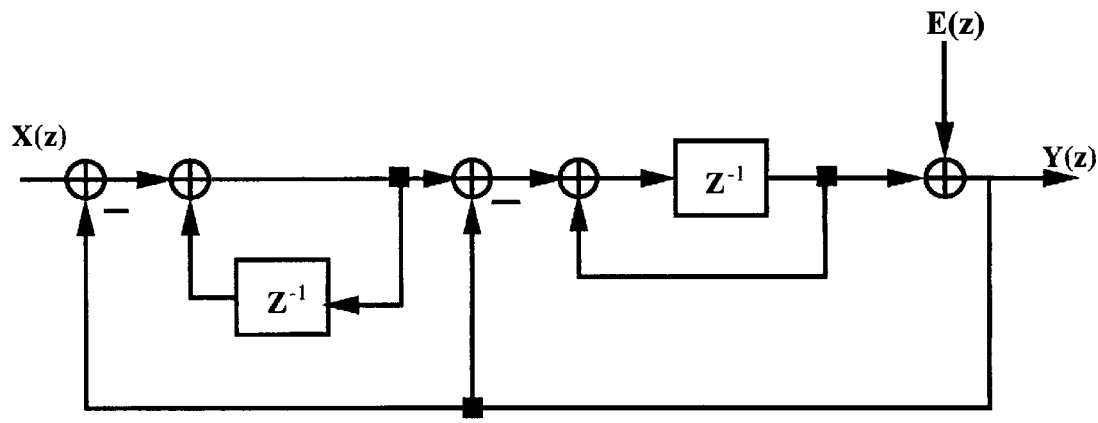
Figure 1C:
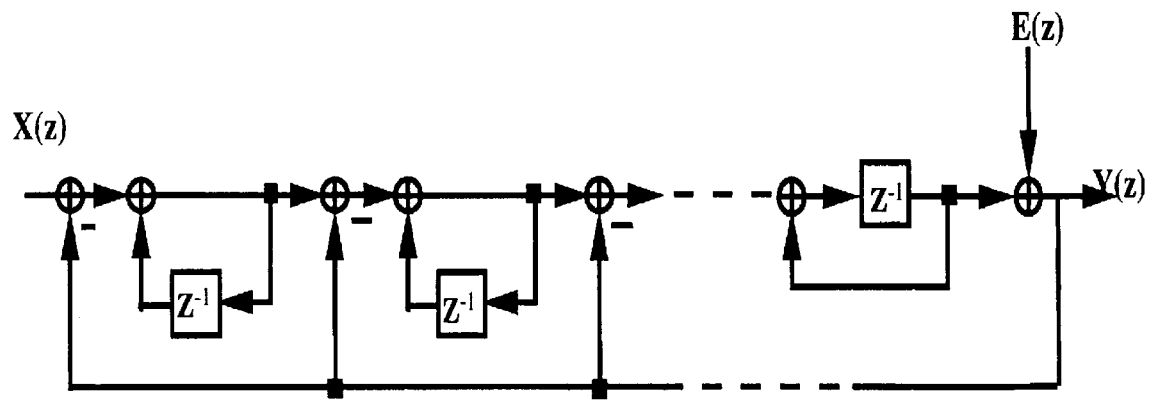
Figure 2A:
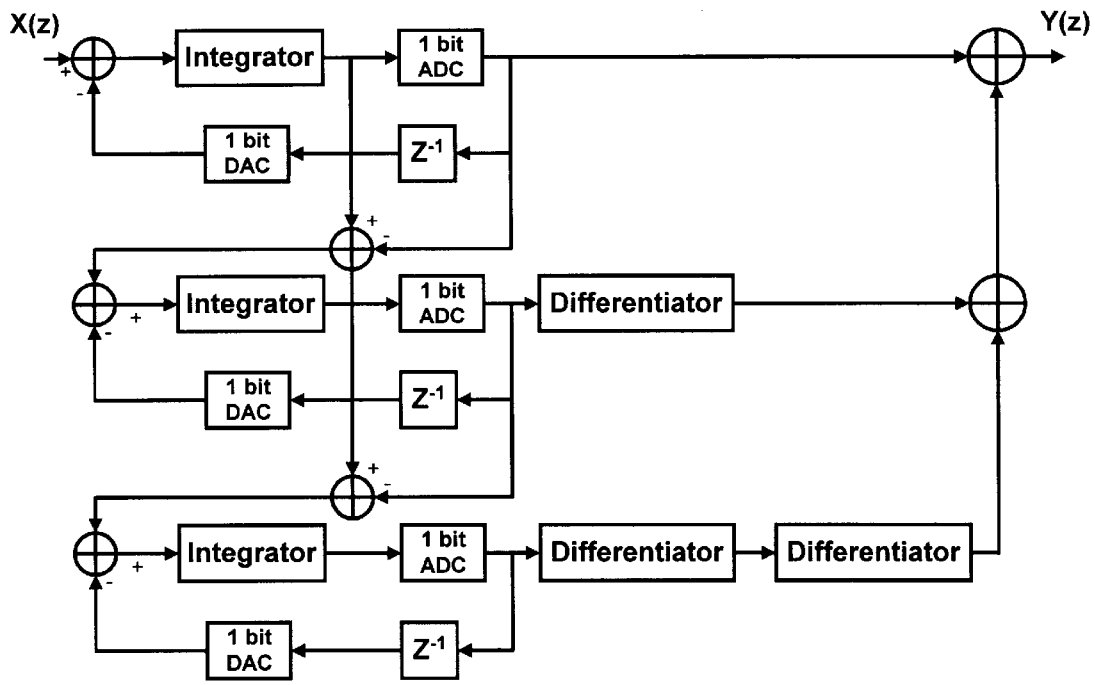
Figure 2B:
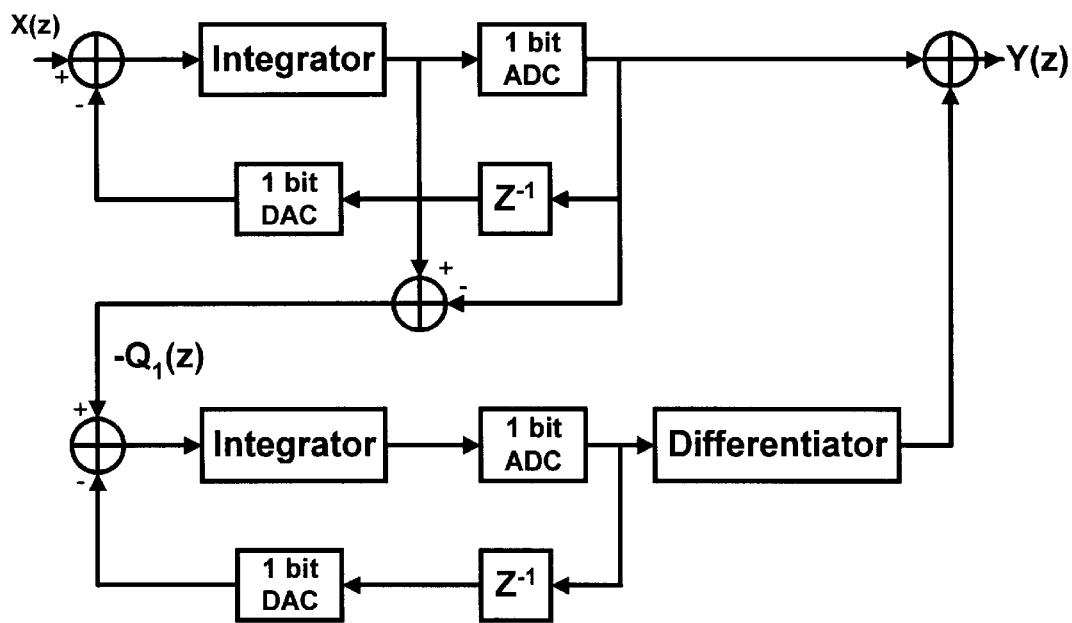

If we look carefully into the conventional MASH architecture illustrated in FIG. 2(b), the structures of the first and second stages are virtually the same. The differences between these two stages are as follows: The input of the first stage is the analog input signal X(z), while that of the second stage is the quantization error $-Q_1(z)$ from the first stage. In addition, the output of the second stage must pass through a digital differentiator before adding to the output of the first stage, but the output of the first stage need not. Therefore, we employ the time-division concept to modify the existing MASH architecture and name the new architecture as uni-MASH. Our key idea lies in the architecture and circuit reuse in the different stages of MASH.

Figure 3:
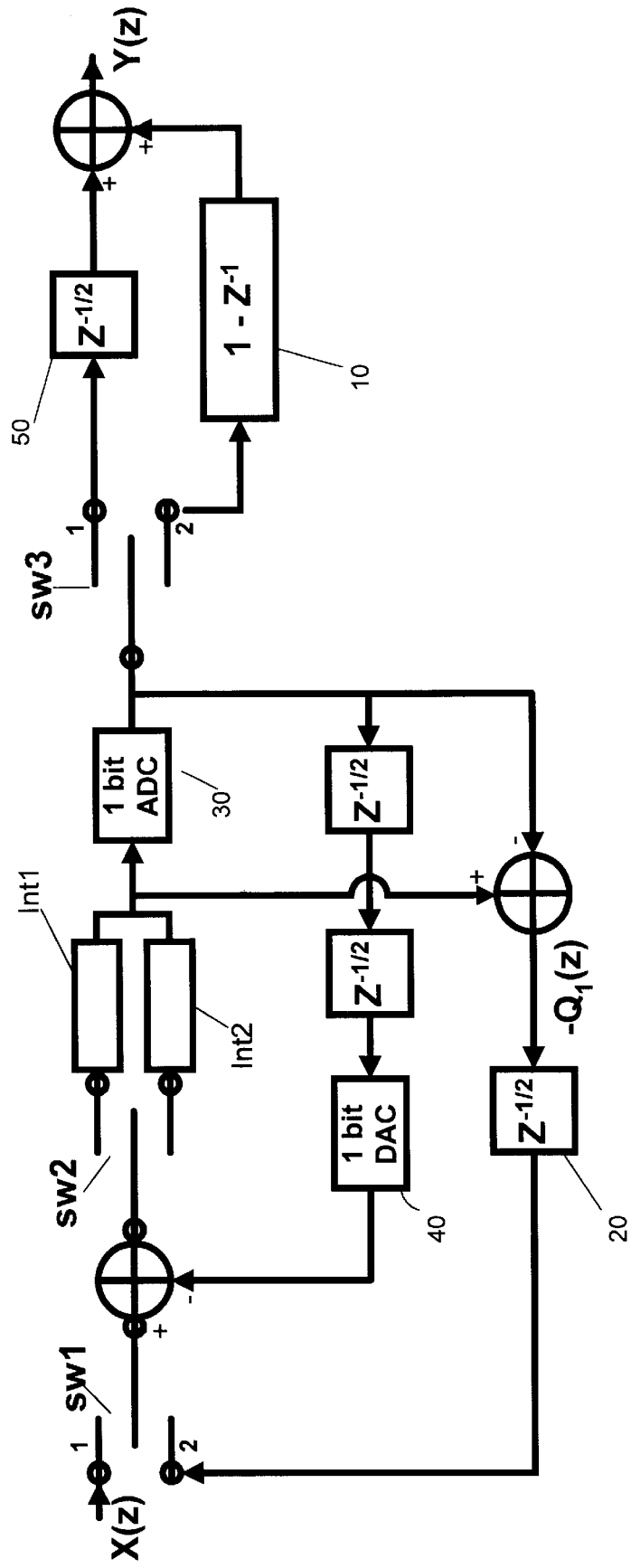
FIG. 3 is a block diagram showing an architecture of a two-stage uni-MASH modulator for analog-to-digital conversion constructed in accordance with a preferred embodiment of the present invention.
Figure 4A:
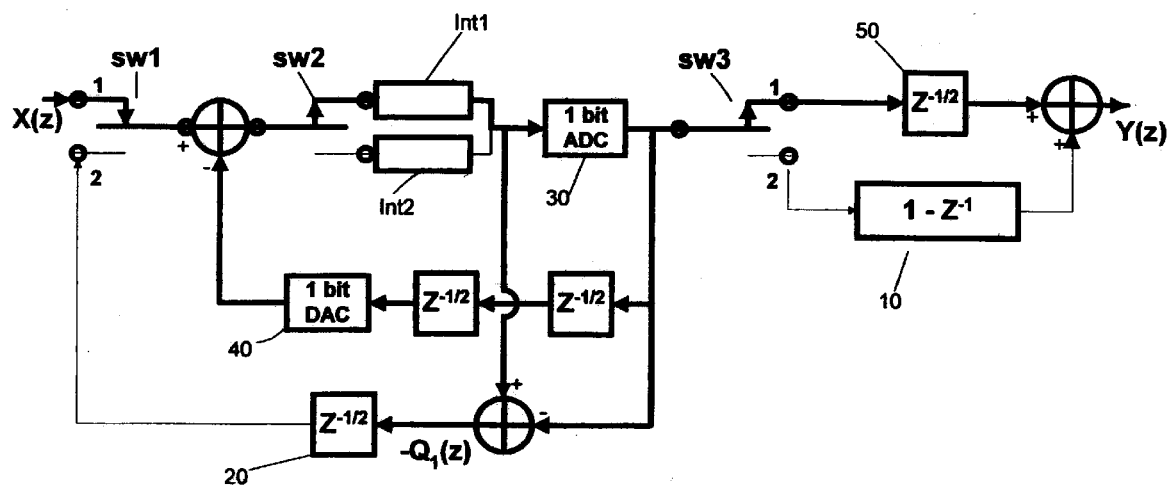
FIGS. 4(a) and 4(b) are block diagrams highlighting operations of the two-stage uni-MASH modulator shown in FIG. 3 in the first stage and the second stage, respectively.
Figure 4B:
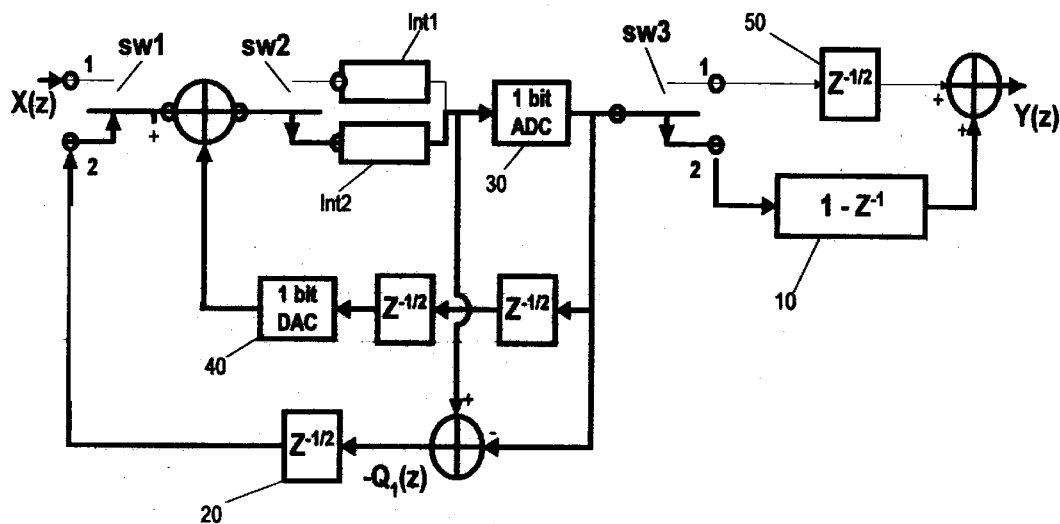

Recognizing the similarities in the different stages of MASH, we propose the uni-MASH architecture as shown in FIG. 3 to reduce the unnecessary circuits in the conventional MASH. The operation principle of the uni-MASH architecture is explained below: At the beginning, switch sw1 decides what will be the input to the modulator (X(z) or $-Q_1(z)$). If X(z) is the input, then integrator int1 is selected by switch sw2; otherwise, integrator int2 is selected. Finally, switch sw3 decides if the differentiator 10 is necessary. FIGS. 4(a) and 4(b) highlight the data path of the uni-MASH modulator shown in FIG. 3 which corresponds to the first or second stage operation of the two-stage MASH. In the FIGS. 4(a) and 4(b), the useless data path which corresponds to the desired stage is shown in thin line. Since the time division concept is employed in the proposed architecture, additional delay must be added into the signal path to account for the latency. In the first stage operation as shown in FIG. 4(a), the integrator int1 integrates a difference between the input X(z) and a feedback signal, and an output of the first stage which is generated at an output terminal of a quantizer 30 is fed to a delay 50 and is to be added to an output from the differentiator 10 in the second stage operation. Said feedback signal is obtained the same way as in the conventional MASH modulator and by converting the output of the quantizer 30 to an analog signal via a digital-to-analog converter 40 (1 bit DAC). In the second stage operation as shown in FIG. 4(b), the integrator int2 integrates a difference between a quantization error of the first stage (the first quantization error) and a feedback signal, and an output of the second stage which is generated at an output terminal of a quantizer 30 is fed to the differentiator 10. Said first quantization error is a difference of the output from the integrator int1 and the output from the quantizer 30 in the first stage operation, and is stored in a delay 20 until the first stage operation is completed. It can be clearly seen from FIGS. 4(a) and 4(b) that the quantizer 30 and the digital-to-analog converter 40 are common elements in the first and second stage operation.

The transfer function of two-stage MASH architecture realized by uni-MASH architecture in FIG. 3 is as follows:

$$C_1 = X + (1 - Z^{-1})Q_1$$

$$C_2 = -Q_1 Z^{-1/2} + (1 - Z^{-1})Q_2$$

$$Y = Z^{-1/2}C_1 + (1 - Z^{-1})C_2$$

$$= X + (1 - Z^{-1})Z^{-1/2}Q_1 - (1 - Z^{-1})Z^{-1/2}Q_1 + (1 - Z^{-1})^2 Q_2$$

$$= XZ^{-1/2} + (1 - Z^{-1})^2 Q_2$$

$C_1$: first-stage digital output   $C_2$: second-stage digital output $Q_1$: first-stage quantization noise   $Q_2$: second-stage quantization noise Y: digital output signal   X: analog input signal With the exception of the delayed input signal in uni-MASH, all characteristics of the transfer functions between uni-MASH and MASH are identical.

Figure 5B:
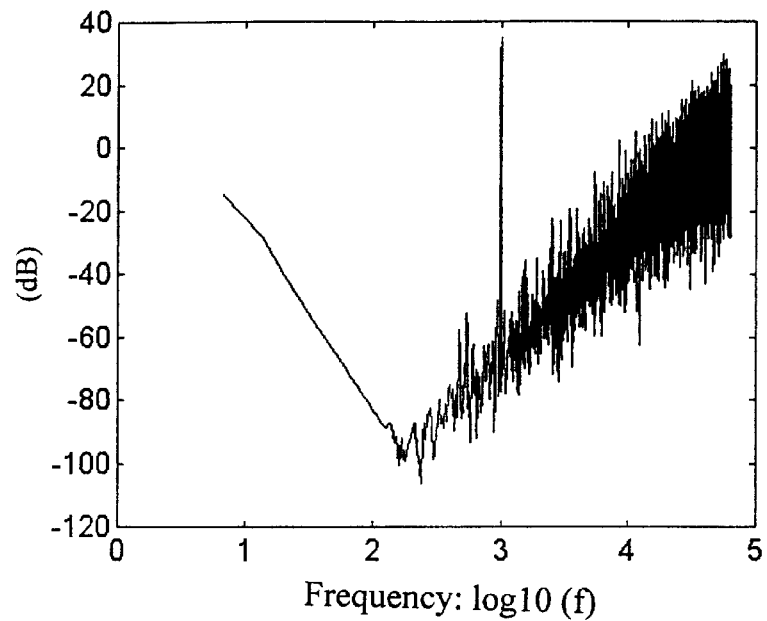
FIG. 5(b) is a simulated power spectrum of the modulator having the uni-MASH architecture shown in FIG. 3, wherein the input signal is a 1 kHz sinusoidal signal, the sampling frequency is 128 kHz and the oversampling ratio is 64.
Figure 5B:
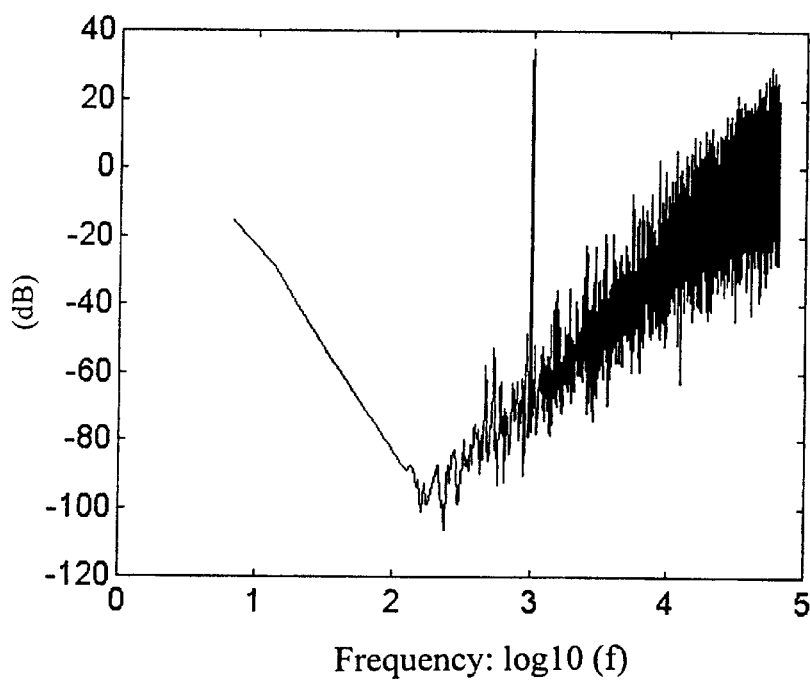

Besides, according to the simulated power spectra of the MASH and the uni-MASH modulators shown in FIGS. 5(a) and 5(b), they both have the same output SNR (106 dB) that corresponds to 16 bit resolution and the same dynamic range (106 dB). Here the input signal is a 1 kHz sinusoidal signal; the sampling frequency is 128 kHz and the oversampling ratio is 64. Apparently, uni-MASH has the same performance as MASH. However, the number of operational amplifiers and capacitors required in uni-MASH is greatly reduced, which will be readily understood from the following FIGS. 7(a) and 7(b).

Figure 6:
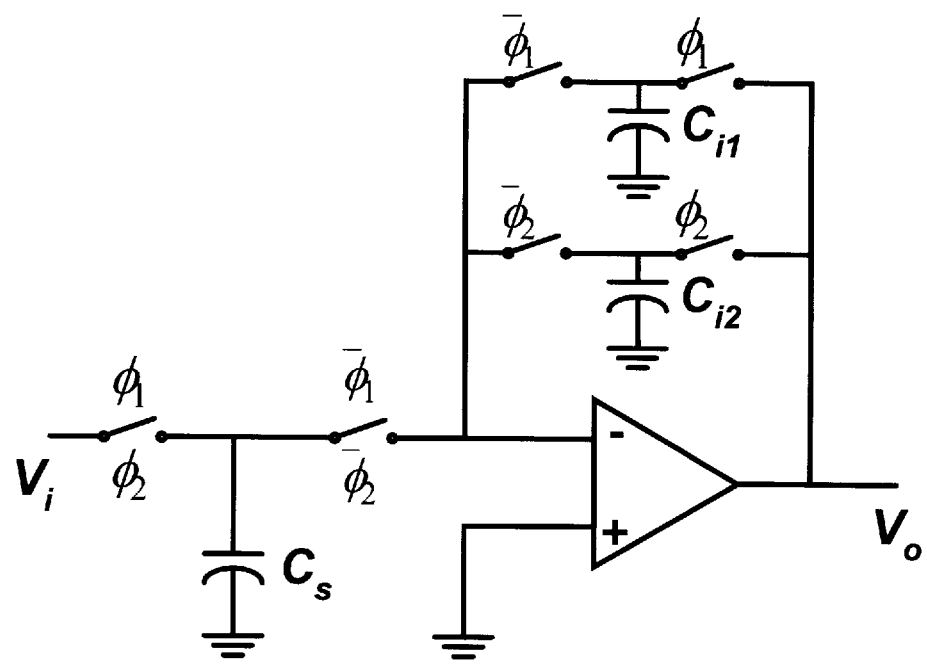
FIG. 6 is a circuit configuration of time- and capacitor-multiplexing switched-capacitor integrator which realizes the two parallel integrators int1 and int2 of the uni-MASH modulater in FIG. 3.

Although two parallel integrators are shown in FIG. 3, only one amplifier is enough to implement these two (or more) integrators. FIG. 6 shows that two parallel integrators is realized by time- and capacitor-multiplexing switched-capacitor integrator. In this circuit configuration for two (or more) parallel integrators, the switching frequency must be doubled (or more) to account for our time-division architecture. When capacitor $C_s$ is charged to the input signal (voltage) $V_i$, capacitors $C_{i1}$ and $C_{i2}$ are all discharged. On the other hand, when the voltage on $C_s$ is applied to the operational amplifier, either $C_{i1}$ or $C_{i2}$ forms the feedback path to perform integration depending on which integrator is chosen by switch sw2 in the uni-MASH modulator shown in FIG. 3.

Figure 7A:
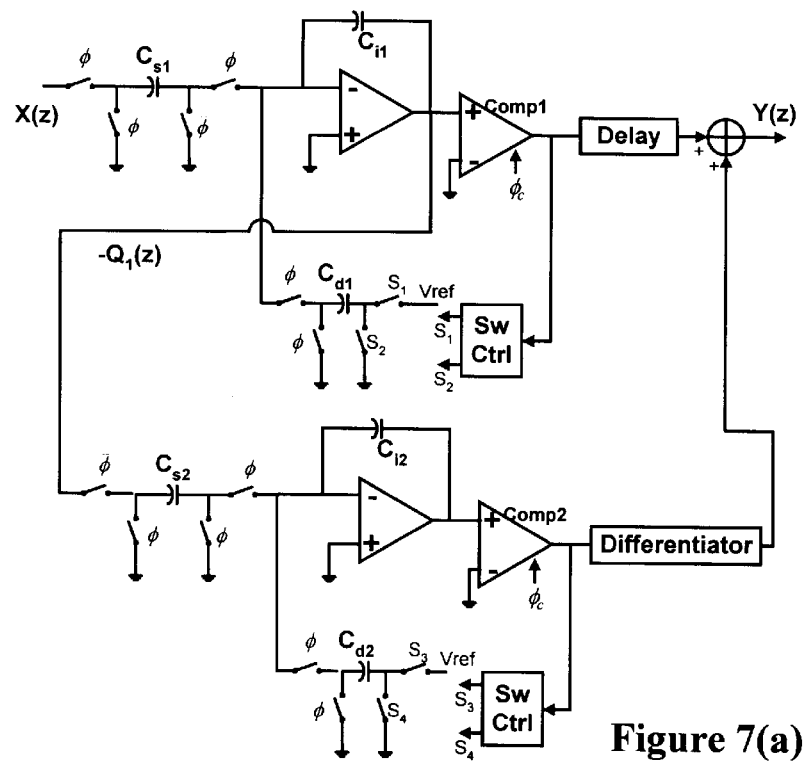
FIG. 7(a) shows a circuit configurations of the conventional MASH modulator shown in FIG. 2(b) together with clock timing thereof.

In VLSI implementation shown in FIG. 7(a), the MASH architecture must tolerate finite gain in operational amplifier and capacitor ratio mismatch in the analog circuits. A gain mismatch between different stages in the MASH modulator causes the degradation of output SNR. Usually, the gain mismatch is determined by the accuracy of the capacitor ratio which decides the scaling factor between the input analog signal and feedback signal from the DAC.

Let the gain of each first-ordered SDM be defined as the ratio between its digital output and analog input. As shown in FIG. 2(b), $C_1$ and $C_2$ are the ideal output at the ideal first-ordered SDM (with gain 1). $\alpha\, C_1$ and $\beta\, C_2$ are the digital outputs at the nonideal first-ordered SDM (with gain $\neq 1$). Then the transfer function of the two-stage MASH becomes:

$$Y = \alpha C_1 + \beta(1 - Z^{-1})C_2$$
$$= \alpha X + (\alpha - \beta)(1 - Z^{-1})Q_1 + \beta\, (1 - Z^{-1})^2 Q_2$$

$Q_1$: first-stage quantization noise   $Q_2$: second-stage quantization noise $Y$: digital output   $X$: analog input $C_1$: first-stage output in ideality   $C_2$: second-stage output in ideality $\alpha$: first-stage output in ideality   $\beta$: second-stage output in ideality Apparently, the first stage quantization error is not exactly cancelled in reality such that output performance degrades.

Figure 7B:
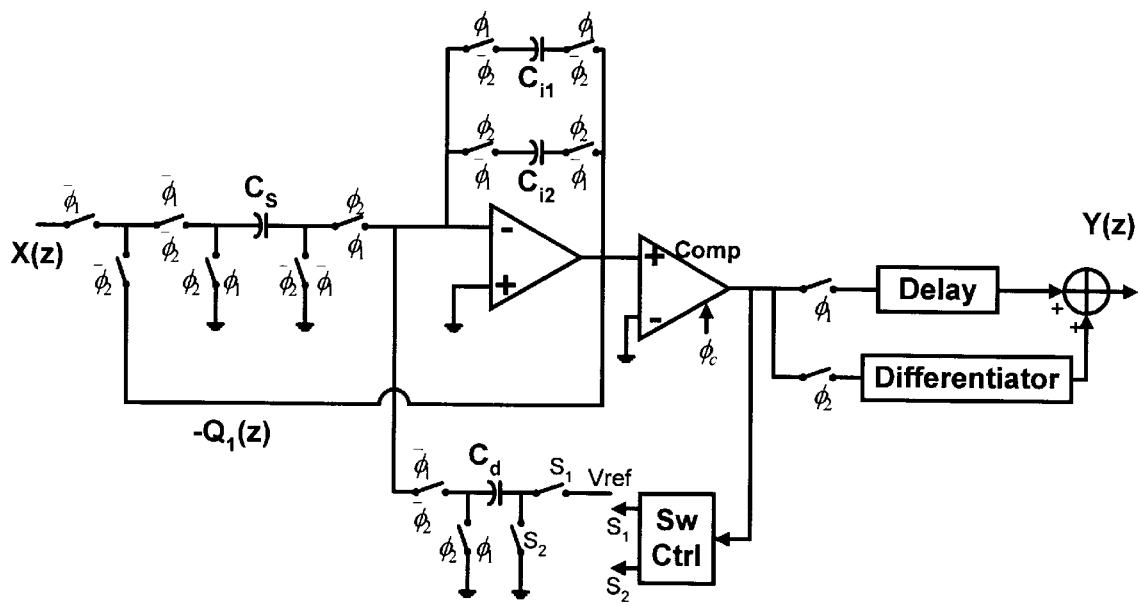
FIG. 7(b) shows a circuit configuration of the modulator shown in FIG. 3 together with clock timing thereof.

However, uni-MASH uses the same first order SDM circuit for both the first and second stage operations of MASH, as shown in FIG. 7(b). So the gain mismatch effect is reduced. Specifically, uni-MASH shares the same sampling capacitor $C_s$ and feedback capacitor $C_d$ in both the first and second stage SDM. Therefore, the gain mismatch effect which is produced by different sampling capacitors $C_s$ and feedback capacitors $C_d$ in MASH is also removed in uni-MASH.

Finally, different operational amplifiers are used to synthesize the integrators in the different stages of conventional MASH (FIG. 7(a)). Due to the concept of architecture reuse and circuit shown in FIG. 6, only one operational amplifier is required in the integrators of uni-MASH (FIG. 7(b)). Thus the mismatch effect from using different operational amplifiers for different integrators in MASH does not exist in uni-MASH. The only mismatch effect left results from the integrating capacitors in the integrators. In addition, due to the circuit reuse, the chip size of the proposed uni-MASH (FIG. 7(b)) is reduced.

In the uni-MASH modulator for D-to-A convertor, the integrators and feedback circuits can easily be implemented with switched capacitor technique as MASH. A two-stage uni-MASH architecture suitable to MOS VLSI technology consists of only one 1-bit comparator, a time- and capacitor-multiplexing switched-capacitor integrator, a digital differentiator, and an additional delay element, as shown in FIG. 7(b). The input signals to the first stage or second stage is sampled by capacitor $C_s$ and integrated to $C_{i1}$ or $C_{i2}$ by turns. The quantized 1-bit signal of the first stage or second stage is fed back to the input by charging a reference voltage into feedback capacitor $C_d$. The comparator and analog switches are controlled by a sequence clock shown in FIG. 7(b).

The clock timing is divided into four phases per cycle, $\bar{\phi}_1 \rightarrow \phi_1 \rightarrow \bar{\phi}_2 \rightarrow \phi_2 \rightarrow \bar{\phi}_1$, in uni-MASH. In the first quarter cycle, the analog input signal is sampled by $C_s$, and the previous second-stage quantized output is integrated to $C_{i2}$ by feedback capacitor $C_d$. In the second quarter cycle, the first-stage input signal sampled by $C_s$ is integrated to $C_{i1}$. End the integration of the charge in $C_{i1}$, the comparator compares the integrator output value and the GND level simultaneously. Next feedback capacitor $C_d$ is precharged to positive or negative full-scale charges depending on whether the quantizer is high or low. In the third quarter cycle, the integrator accumulates the first-stage quantized output signal from the comparator to $C_{i1}$ by $C_d$. Then the integrator output at this time is sampled by $C_s$ for the input to the second stage operation. Because the value of the integrating capacitor $C_{i1}$ in this quarter cycle is equal to the difference between integrator output and quantizer output of the first stage operation in MASH (FIG. 2(b)). In the fourth quarter cycle, the integrator accumulates the second-stage input signal to integrating capacitor $C_{i2}$, then feedback capacitor $C_d$ is precharged a reference voltage related to the second-stage quantized signal for the output of the second-stage feedback D-to-A converter.

What is claimed is:

1. An oversampling converter with sampling frequency sufficiently higher than an input signal frequency comprising N integrators (N is an integer not less than 2) in parallel for integrating a difference between an input terminal signal and a feedback signal; a quantizer for quantizing an output from each of said N integrators; means for converting an output from said quantizer to said feedback signal; means for detecting a (n-1)th quantization error generated by said quantizer when said quantizer quantizes an output from a (n-1)th integrator (n is an integer of 2 to N) of said N integrators; wherein a first loop output signal is generated at an output terminal of said quantizer when an output of a first integrator of said N integrators is quantized by said quantizer, and a nth loop output signal is generated at an output terminal of said quantizer when an output of a nth integrator of said N integrators is quantized by said quantizer; a first switch for selectively supplying an input signal as said input terminal signal to said first integrator or supplying said (n-1)th quantization error as said input terminal signal to said nth integrator; a second switch for selectively supplying said first loop output signal to a delay or supplying said nth loop output signal to a nth differentiator with a transfer function of a reciprocal number of a product of transfer functions of said first to (n-1)th integrators; an adding means for adding outputs from said differentiators to said first loop output signal from said delay; and a switch control means for controlling said first and second switches so that said input signal and said (n-1)th quantization error are supplied in sequence to the first integrator and said nth integrator, and said first loop output signal and said nth loop output signal are supplied in sequence to said delay and said nth differentiator.

2. The oversampling converter according to claim 1, wherein said N integrators are realized by a time- and capacitor-multiplexing switched-capacitor integrator which comprises an operational amplifier having its non-inverting (+) terminal grounded, and N capacitors each of which is connected in parallel between an inverting (−) terminal and an output terminal of said operational amplifier through a switch circuit, wherein said switch circuits are controlled by a switch control circuit so that a first or a nth capacitor is connected between said inverting terminal and said output terminal of said operational amplifier when said first integrator or said nth integrator is operated.

3. The oversampling converter according to claim 1, wherein said means for detecting a (n-1)th quantization error comprises an adding means for providing a difference as said (n-1)th quantization error between said output from said (n-1)th integrator and said output from said quantizer.

4. The oversampling converter according to claim 1, wherein said means for converting an output from said quantizer to said feedback signal has a diginal-to-analog conversion function for converting a digital input signal to an analog signal.

\* \* \* \* \*